United States Patent
Badam et al.

(10) Patent No.: US 9,952,769 B2
(45) Date of Patent: Apr. 24, 2018

(54) DATA STORAGE SYSTEM WITH DATA STORAGE DEVICES OPERATIVE TO MANAGE STORAGE DEVICE FUNCTIONS SPECIFIC TO A PARTICULAR DATA STORAGE DEVICE

(71) Applicant: Microsoft Technology Licensing, LLC, Redmond, CA (US)

(72) Inventors: Anirudh Badam, Issaquah, WA (US); Bikash Sharma, Bellevue, WA (US); Laura Marie Caulfield, Woodinville, WA (US); Badriddine Khessib, Redmond, WA (US); Suman Kumar Nath, Redmond, WA (US); Jian Huang, Atlanta, GA (US)

(73) Assignee: MICROSOFT TECHNOLOGY LICENSING, LLC., Redmond, WA (US)

( * ) Notice: Subject to any disclaimer, the term of this patent is extended or adjusted under 35 U.S.C. 154(b) by 69 days.

(21) Appl. No.: 15/141,771

(22) Filed: Apr. 28, 2016

(65) Prior Publication Data
US 2017/0075594 A1 Mar. 16, 2017

Related U.S. Application Data

(60) Provisional application No. 62/218,525, filed on Sep. 14, 2015, provisional application No. 62/218,523, filed on Sep. 14, 2015.

(51) Int. Cl.
*G06F 13/00* (2006.01)
*G06F 3/06* (2006.01)
(Continued)

(52) U.S. Cl.
CPC ............ *G06F 3/0605* (2013.01); *G06F 3/061* (2013.01); *G06F 3/064* (2013.01); *G06F 3/0614* (2013.01);
(Continued)

(58) Field of Classification Search
CPC ...... G06F 3/0605; G06F 3/0643; G06F 3/064; G06F 3/0614; G06F 3/0685;
(Continued)

(56) References Cited

U.S. PATENT DOCUMENTS 6,571,351 B1 5/2003 Mitaru et al.
8,688,899 B2 4/2014 Nellans et al.
(Continued)

OTHER PUBLICATIONS

Zuck, et al., LSDM: Improving the Performance of Mobile Storage with a Log-Structured Address Remapping Device, in Proceedings of Eighth International Conference on Next Generation Mobile Apps, Services and Technologies, Sep. 10, 2014, 8 pages.
(Continued)

Primary Examiner — Hong Kim
(74) Attorney, Agent, or Firm — Merchant & Gould P.C.

(57) ABSTRACT

Operations of a variety of components of a storage system stack are redefined to make the system more efficient when the underlying media has a "multi-log" type interface such as the case with NAND flash SSD memory or shingled magnetic recording media. The responsibilities of components of the storage system stack are modified such that each responsibility is performed at the most efficient component (level of abstraction) of the storage stack.

19 Claims, 7 Drawing Sheets

(51) Int. Cl.
*G11C 16/10* (2006.01)
*G11C 16/26* (2006.01)
*G11C 16/14* (2006.01)
*G06F 12/10* (2016.01)
*G11B 20/12* (2006.01)

(52) U.S. Cl.
CPC .......... *G06F 3/0616* (2013.01); *G06F 3/0632* (2013.01); *G06F 3/0638* (2013.01); *G06F 3/0643* (2013.01); *G06F 3/0659* (2013.01); *G06F 3/0673* (2013.01); *G06F 3/0685* (2013.01); *G06F 12/10* (2013.01); *G11B 20/1217* (2013.01); *G11C 16/10* (2013.01); *G11C 16/14* (2013.01); *G11C 16/26* (2013.01); *G06F 2212/1016* (2013.01); *G06F 2212/1036* (2013.01); *G11B 2020/1238* (2013.01); *G11B 2020/1292* (2013.01)

(58) Field of Classification Search
CPC ...... G06F 3/0632; G06F 3/0659; G06F 12/10; G06F 3/0673; G06F 3/0638; G06F 3/06; G06F 3/061; G06F 2212/1016; G06F 2212/1036; G06F 3/0616; G11B 20/1217; G11B 2020/1292; G11B 2020/1238; G11C 16/10; G11C 16/14; G11C 16/26
USPC .................................. 711/170, 103; 707/821
See application file for complete search history.

(56) References Cited

U.S. PATENT DOCUMENTS

| | | | |
|---|---|---|---|
| 8,769,185 B2 | 7/2014 | Chung | |
| 2002/0023179 A1* | 2/2002 | Stanley | G06F 9/4411 710/8 |
| 2005/0193235 A1 | 9/2005 | Sandorfi et al. | |
| 2006/0117132 A1* | 6/2006 | Gray | H04L 67/1097 711/100 |
| 2006/0248241 A1 | 11/2006 | Danilak | |
| 2008/0059742 A1 | 3/2008 | George et al. | |
| 2011/0035548 A1 | 2/2011 | Kimmel et al. | |
| 2013/0132638 A1* | 5/2013 | Horn | G06F 12/0871 711/103 |
| 2014/0201431 A1* | 7/2014 | Woo | G06F 3/0604 711/103 |
| 2015/0012689 A1* | 1/2015 | Atkisson | G06F 12/0246 711/103 |
| 2015/0019792 A1 | 1/2015 | Swanson et al. | |
| 2015/0052295 A1 | 2/2015 | Danilak et al. | |
| 2015/0121003 A1* | 4/2015 | Rosenband | G06F 3/061 711/114 |
| 2015/0277805 A1* | 10/2015 | Cheng | G06F 3/0658 711/154 |
| 2016/0139834 A1* | 5/2016 | Hanson | H04L 67/30 711/114 |
| 2017/0075583 A1* | 3/2017 | Alexander | G06F 3/0605 |

OTHER PUBLICATIONS

Min, et al., "SFS: Random Write Considered Harmful in Solid State Drives", In Proceedings of the 10th USENIX conference on File and Storage Technologies, Feb. 14, 2012, 16 pages.

Tam Vo, et al., "LogBase: A Scalable Log-structured Database System in the Cloud", In Proceedings of the VLDB Endowment, vol. 5, Issue 10, Aug. 27, 2012, pp. 1004-1015.

Narayanan, et al., "Migrating Server Storage to SSDs: Analysis of Tradeoffs", n Proceedings of the Fourth EuroSys Conference, Apr. 1, 2009, pp. 145-158.

* cited by examiner

DATA STORAGE SYSTEM WITH DATA STORAGE DEVICES OPERATIVE TO MANAGE STORAGE DEVICE FUNCTIONS SPECIFIC TO A PARTICULAR DATA STORAGE DEVICE

CROSS REFERENCES TO RELATED APPLICATIONS

This application claims the benefit of U.S. Provisional Patent Application No. 62/218,525, titled "Storage Stack Architecture for Many-log Structured Media" filed Sep. 14, 2015 and claims the benefit of U.S. Provisional Patent Application No. 62/218,523, titled "Exposing and Managing Disparate Read, Write, and Erase Sizes in Data Storage Devices" filed Sep. 14, 2015.

BACKGROUND

Modern computing devices are capable of processing enormous amounts of data via a variety of useful applications that operate as software, firmware and hardware implementations. As data is processed, it is typically written to a temporary memory medium where it may be stored while the associated computing device is powered on or until it is written to a more permanent type of memory where it may be stored indefinitely even after power has been removed from the associated computer or from the memory medium itself. Data that is stored to memory may eventually be output or it may be modified, erased from memory, overwritten, or the like as the data is processed or otherwise manipulated as desired by a user.

Common types of non-volatile memory that maintain data after power-off include hard disk drives that magnetically maintain data on sectors of disks or platters, including higher density disk storage with shingled magnetic recording (SMR) disk drives, as well as, a variety of solid state memory devices (SSD) that store data on interconnected memory chips contained inside the SSDs. In a typical data storage system associated with a variety of computing devices, a host operation or device, for example, a computing operating system or a storage system component such as a device driver operating at the command of the computer operating system, passes data storage instructions to a control unit of the storage medium for directing read, write, and erase operations on the storage medium.

In a typical operation, a variety of problems can be associated with data storage to such devices. For example, in the case of SSD systems, write amplification can be particularly problematic where the actual amount of data written to the SSD media can be much greater (e.g., five times) the logical amount that is actually desired to be written to the medium. Such write amplification unnecessarily uses storage system resources, ties up memory capacity, and degrades the available lifetime or life expectancy of the storage medium. In addition, storage performance can be unpredictable and inconsistent, and storage latencies can be experienced. In data centers of various sizes and other multi-application scenarios, effective storage performance can fail to provide full performance and the storage device's lifetime can be significantly reduced (e.g., up to an 80% reduction), even when applications are not concurrent and write the same total amount of data.

It is with respect to these and other considerations that the present disclosure has been made.

SUMMARY

This summary is provided to introduce a selection of concepts in a simplified form that are further described below in the Detailed Description section. This summary is not intended to identify key features or essential features of the claimed subject matter, nor is it intended as an aid in determining the scope of the claimed subject matter.

According to aspects of the present disclosure, operations of a variety of components of the storage system stack are redefined to make the system more efficient when the underlying media has a "multi-log" type interface, such as the case with NAND flash SSD memory or shingled magnetic recording media. The responsibilities of components of the storage system stack are modified, such that each responsibility is performed at the most efficient component (level of abstraction) of the storage stack.

The details of one or more aspects are set forth in the accompanying drawings and description below. Other features and advantages will be apparent from a reading of the following detailed description and a review of the associated drawings. It is to be understood that the following detailed description is explanatory only and is not restrictive of the claims.

BRIEF DESCRIPTION OF THE DRAWINGS

The accompanying drawings, which are incorporated in and constitute a part of this disclosure, illustrate various aspects. In the drawings.

DETAILED DESCRIPTION

Figure 1:
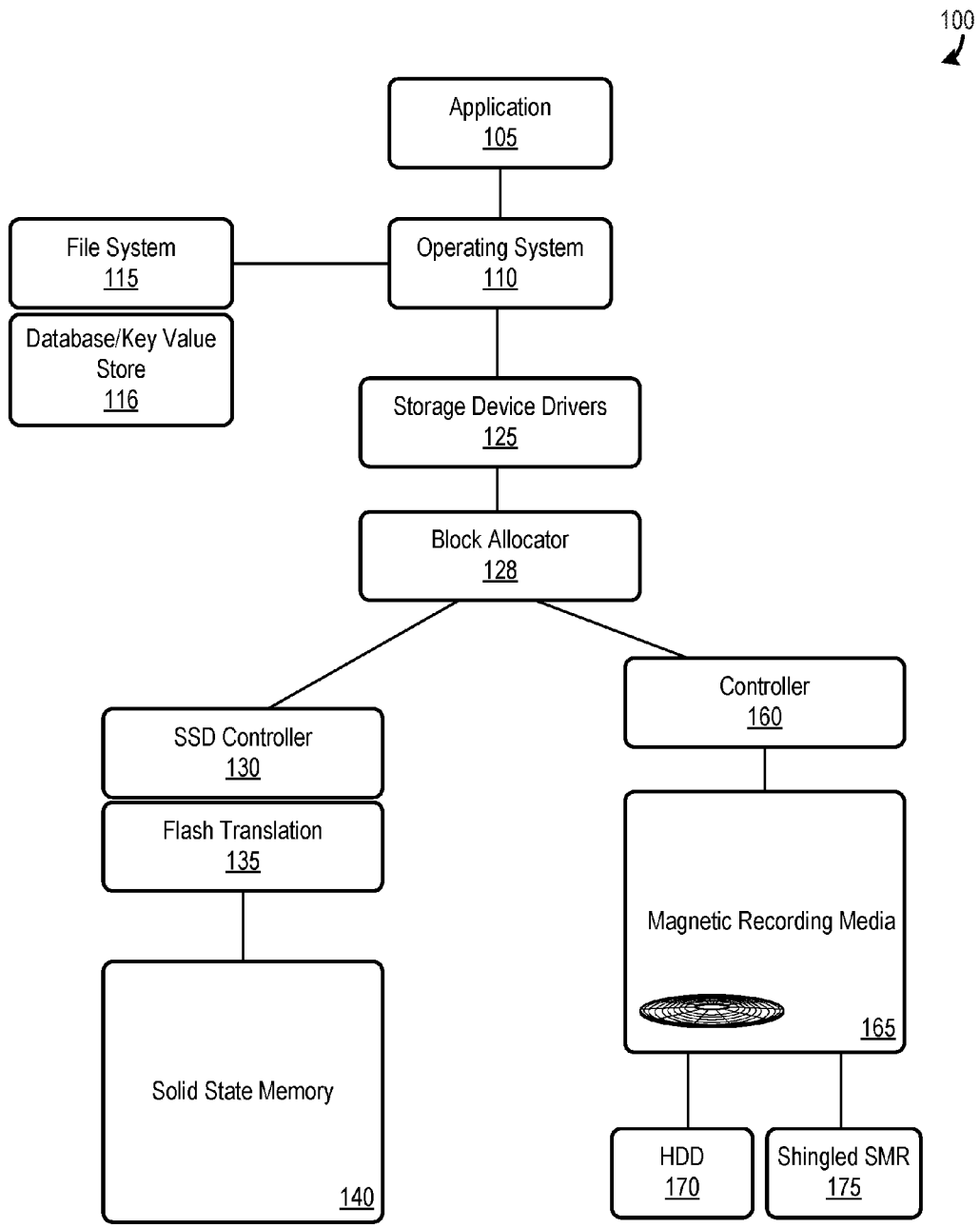
FIG. 1 is a block diagram illustrating components of a data storage system.

The following detailed description refers to the accompanying drawings. Wherever possible, the same reference numbers are used in the drawings and the following description refers to the same or similar elements. While examples may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description is not limiting, but instead, the proper scope is defined by the appended claims. Examples may take the form of a hardware implementation, or an entirely software implementation, or an implementation combining software and hardware aspects. The following detailed description is, therefore, not to be taken in a limiting sense.

As briefly described above, according to aspects of the present disclosure, operations of a variety of components of the storage system stack are redefined to make the system more efficient when the underlying media has a "multi-log" type interface, such as the case with NAND flash SSD memory or shingled magnetic recording media (SMR). According to one aspect, the responsibilities of components of the storage system stack are modified such that each responsibility is performed at the most efficient component (level of abstraction) of the storage stack. For example, according to an example aspect, a block allocator interface is positioned between the host layer of the storage system stack and the storage device (SSD or SMR) that allows the storage device controller unit or functionality to manage media reliably (for example, wear leveling, error correction coding, read-retry, data encryption, garbage collection, and the like), but it exposes sequential writes of many small logs up to the file system.

This division of operations among components of the storage stack is more efficient and improves the overall operation of the storage system stack or data storage operations as compared to placing both responsibilities in either the storage device hardware or software, because the storage device hardware is better suited for media management and the file system software is better suited for converting between random writes from the application and sequential writes to the hardware. In addition, according to another aspect, policies for managing parallelism with the correct level of abstraction are exposed between the storage device driver layer and the storage system stack, including components such as the file system, the key-value store, database, and the like.

According to aspects of the disclosure, a number of problems may be addressed. First, with respect to write amplification in SSDs, write amplification may be reduced or eliminated by providing the host layer with greater control over write operations and by separating write functions between users/tenants to prevent the storage devices from unnecessarily amplifying writes directed to associated media. By reducing or eliminating write amplification, less expensive SSDs (with lower endurance NAND flash arrays) may be utilized and/or SSD drives may be used longer. In addition, by reducing or eliminating write amplification, storage performance is improved (faster, less memory consumption, less processor consumption, etc.) because the number of actual writes to the storage device is greatly reduced. In terms of media management activities on the SSD, such as garbage collection, according to aspects, users may select policies to enforce when and what activities are directed to the SSD. In datacenters, where multiple applications are placed and run on the same hardware, interactions between applications can greatly reduce performance even when those applications operate at different times (and write the same total amount of data). According to aspects of the present disclosure, the storage system stack isolates such applications for obtaining optimum performance and endurance.

FIG. 1 is a block diagram illustrating components of a data storage stack that is one example of an operating environment for aspects of the present disclosure. The components of the system 100 are illustrative of one or more components that may be associated with or included in a computer-implemented data storage system for reading, writing, and erasing data to one or more data storage media. According to an aspect of the disclosure, the storage system 100 is made up of a number of levels of abstraction, each of which plays a role in improving performance of the overall storage stack's data storage performance and management. According to this aspect, the responsibilities of the components (levels of abstraction) are redefined as described herein for obtaining the improved performance and management. The components of the improved storage stack include a storage system comprised of a file system (or database or key value store), a block allocator, a host lowest level device driver that performs scheduling, storage device firmware, and storage device media.

At the top of the system 100, an application 105 is illustrative of any application, for example, a word processing application, slide presentation application, spreadsheet application, database application, browser application, communications application, notes taking application, calendaring application, and the like with which a user may create, edit, modify, store, save, delete, or otherwise manipulate data of various types and quantities. An operating system 110 is illustrative of a hardware device, firmware system, or software system operative to control input and output to and from a general purpose or mobile computing system, as illustrated and described below with reference to FIGS. 4 and 5A-5B and for serving as a general interface between applications 105 and local and peripheral operations of one or more computing devices.

The file system 115 is illustrative of a device, device firmware and/or collection of one or more files accessible by the operating system 110 that contains information used for controlling how data is stored, how space is allocated in a granular manner, and for organizing the storage of data on one or more storage devices, as described below. According to aspects of the disclosure, the file system understands the architecture of the storage devices 140, 165 to which data will be directed for storage. For example, in terms of garbage collection, the file system 115 may understand the garbage collection policies and status of a given storage device 140 so that the file system may match write allocation to garbage collection units that may be freed up for allocation.

According to aspects, the file system 115 is capable of exploiting the functions of the SSD 140 and HDD 165. When more storage control is placed between the host layer and the storage layer 140, 165, as described herein, and when the target storage devices become more advanced, for example, multi-channel SSDs, then the file system 115 may communicate with the target storage devices via the host device driver layer 125.

According to aspects of the present disclosure, variance (i.e., the ratio of good data to garbage data) will be improved. As variance primarily comes from write amplification, because the file system 115 knows how much live data the application has, as well as, how much garbage each zone has, then the file system knows roughly the distribution between garbage and live data in its own zones. Thus, the file system 115 knows whether it has the ability to write a certain amount of data because it knows how many zones it has to free up and how much garbage is in each zone. As should be appreciated, the file system 115 need not be operated as a traditional file system associated with data storage, but may be any suitable storage system component, including the database or key-value store 116 operative to provide storage instructions to the low-level host component (device driver 125), as described herein.

Referring still to the file system 115, among other responsibilities, the file system may be interrogated for information necessary for allocating storage space for the data when a data item is created via an application 105. For example, if a given data item is comprised of a name, street address, city, state, and zip code, when such a data file is created, the file system 115 may be utilized for allocating space in a solid state memory device or hard drive memory device at which components of the created data at different granularity levels may be stored.

For example, according to one granularity level, each component of the stored name and address data item may serve as one granular level, and thus, storage space may be allocated by the file system 115 for storing the name separately from the street address, separately from the city, separately from the state, and separately from the zip code. At a larger granularity level, the file system 115 may allocate space for saving the entire name and address data item together as a single stored data item. When a data item is modified and no longer fits or now exceeds the space initially allocated for it by the file system 115, another allocation may be assigned by the file system 115, and thus, storage of the data item becomes fragmented.

The database/key-value store 116 is illustrative of a database at which information about stored data may be maintained for access by the operating system 110 and/or the file system 115. For example, data corresponding to the logical association of components of various data items may be stored in the database or key-value store 116 and mapping information for mapping logical data addresses to physical data addresses may also be maintained. For example, a name, street address, city, state, zip code may be logically stored in a single file or in related files in a relational database or key-value store 116. On the other hand, each of the components of the data item (or a combination of components of the data item) may be physically stored on a block or page of a solid state memory device or in a given hard disk platter zone, or components (or combinations of components) of the data item may be stored in separate storage blocks/pages or hard disk platter zones, and information mapping the logical addresses of the components of the data item to the physical addresses at which the components (or combination of components) are actually stored may be maintained in the database or key-value store 116 for accessing by components of the storage system 100, as described herein.

The storage device driver 125 is illustrative of a device, device firmware or software application that operates or controls the solid state memory device 140 or magnetic recording media device 165, described below. The driver 125 may serve as a software or hardware interface to the storage devices for enabling the operating system 110 or other applications 105 to access the functions of the data storage devices without needing to know operating details of the data storage devices. That is, the storage device driver 125 acts as a translator between the operating system 110 and the data storage devices 140, 165.

As described herein, the host layer may be in the form of the device driver 125 with a direct information connection to the storage devices. Alternatively, the host layer may be in the form of components higher in the storage stack such as the file system 115, database or key-value store 116 or even the operating system 110. In either case, the device driver layer 125 may serve as a conduit for information from the storage devices 140, 165 to the host layer. According to aspects, the host layer may query the device 140, 165 for data storage information via the driver layer 125. For example, the devices 140, 165 may report information on all blocks and zones. The driver layer manages the channels in the storage devices and can expose the information up to the file system 115.

The block allocator 128 is illustrative of a device, device firmware or software application operative to interface between the host or driver layer 125 and the storage devices 140, 165. According to aspects, the block allocator 128 is responsible for directing the storage of data to particular storage blocks/pages or sectors/zones, for example, storage of sequential data writes to small multiple blocks rather than large contiguous regions of the SSD or HDD. In addition, the block allocator 128 may direct the storage device controllers to perform device management operations, described herein, but also may expose sequential write of many small logs back up to the file system 115. According to one aspect, the block allocator 128 controls the file system zone allocations into actual allocations on the storage device 140, 165, which is the low level core that monitors how much data each application or each zone, plane, or die is receiving. Based on the statistics that this layer (the block allocator 128) is collecting, wear leveling can also be performed. According to one aspect, the block allocator 128 is responsible, in association with the file system 115, to convert application level isolation allocation properties into actual channel, plane and die level allocations.

As illustrated in FIG. 1, the block allocator 128 is shown between the device driver 125 and the storage devices 140, 165. Alternatively, the block allocator 128 may be positioned in the storage system stack above the device driver 125. In addition, according to one aspect, the block allocator 128 may be integrated with the file system 115.

Beneath the storage device driver 125 and block allocator 128 are illustrated two types of data storage devices. As should be appreciated, any number of data storage devices may be utilized by a computing system for storing data, including solid state storage devices, magnetic recording media devices, optical recording devices, magnetic tape recording devices, and the like. For purposes of illustration, two types of storage devices are illustrated and described with reference to FIG. 1, including a solid state recording device 140 and a magnetic recording media device 165. As should be appreciated, aspects of the present disclosure may be equally applied to any of a number of types of storage devices where the interface between the device driver layer 125 and the storage media is improved, as described herein.

Referring still to FIG. 1, a solid state memory device 140 is illustrative of a non-volatile memory medium onto which data may be persistently stored on one or more integrated circuit chips, boards, or assemblies contained in the solid state memory device 140. Typical solid state memory devices (SSD) may be operated as NAND-based devices or may be operated as NOR-based devices, as is well known to those skilled in the art. SSD devices 140, sometimes also referred to as flash devices, may be operated internally in a computing device, for example, a laptop computer, handheld computing device, mobile telephone, mobile media player, and the like. In addition, SSD memory devices may be operated externally to such a device, and may be plugged into or otherwise attached to a computing device, such as the attachment of a universal serial bus (USB) type flash drive for storing data as described herein. SSD storage devices are well known to those skilled in the art.

The SSD controller 130 is illustrative of a controller device, device firmware or software application associated with or incorporated into the solid state memory device 140 for receiving instructions from the storage device driver 125 for reading, writing, and erasing data to/from the SSD and for controlling operations of the memory device, including various memory device management functions. As is well known to those skilled in the art, such memory functions may include error-correcting code functions (ECC) for managing the correction or recovery of data when errors are introduced to data transmitted to or stored on the solid state memory device. Another function performed by the SSD controller 130 includes wear-leveling, which includes the management of data storage and data erasure applied to the various blocks or pages available on the solid state device for maximizing the available lifetime of the device by evenly distributing data writing and erasure among available storage blocks or pages.

Other management functions performed by the SSD controller 130 include bad block or bad sector management, whereby blocks or pages on which data may be stored that are found to be defective or otherwise inaccessible are mapped and designated by the controller 130 so that such bad blocks or sectors may be bypassed in future read/write/erasure operations. Additional functions that may be performed by the SSD controller 130 include garbage collection and data encryption. As is well known to those skilled in the art, garbage collection includes any number of operations directed by the controller 130 for identifying and removing pieces of data from memory that are no longer in use by a given application 105 or operating system 110 so that memory occupied by such pieces of data may be reclaimed for use in other data read/write operations. As is well known to those skilled in the art, data encryption includes any operation performed on data for formatting or structuring the data such that it may only be accessed, read, modified, or erased by authorized persons. As should be appreciated, the foregoing functions that may be performed by the SSD controller 130 are not exhaustive of all functions that may be performed by the SSD controller 130 with respect to the SSD memory device 140, but are illustrative of the types of functions that may be performed by the SSD controller 130 as illustrated herein.

As briefly described above, one function required for storing data to a memory device such as the SSD memory device 140 includes mapping data from a logical memory address (also referred to as a logical block address or LBA with respect to SSD memory devices) received from the host layer above the storage device driver 125 to a physical block address (PBA) on the actual solid state memory device 140. According to one aspect of the present disclosure, the flash transition layer 135 may be operative to act at the direction of the SSD controller 130 for mapping logical block addresses to physical block addresses, as described herein. While the SSD controller 130 and flash transition layer 135 are illustrated separately from the solid state memory device 140, as should be appreciated by those skilled in the art, these components may be operated separately from the physical memory device 140, or may be integrated inside the solid state memory device 140, as illustrated and described below with reference to FIG. 2A.

Referring to the right side of FIG. 1, a magnetic recording media device 165 is illustrative of a typical hard disk drive storage device with which data may be stored on track sector (zones) of a hard disk or platter contained in the magnetic recording media device 165. A controller 160 is illustrative of a controller for directing data storage read, write, and erasure operations as well as data management operations such as logical to physical storage media mapping, data encryption, error-correcting code (ECC) operations, bad block mapping, wear-leveling, garbage collection, read and write caching, etc., as described above with reference to the solid state memory device 140. The controller 160 is illustrated separate from the magnetic recording media device 165, but as appreciated by those skilled in the art, the controller 160 may be operated as a separate component for controlling the operations of the magnetic recording media device 165 or it may be integrated with the magnetic recording media device 165, as is common with typical hard disk drive or shingled magnetic recording drive systems. As described below with reference to FIG. 2B, magnetic recording media may be implemented according to a variety of different device implementations, for example, basic hard disk drives 170 or shingled magnetic recording devices 175. Magnetic recording media storage devices 165 are well known to those skilled in the art.

According to aspects of the present disclosure, the components of the storage system 100, illustrated and described with reference to FIG. 1, may be implemented according to a variety of physical implementations. For example, all the components of the storage system 100 may be housed internally in a given computing device. For another example, the host layer components and all components above the host layer (including operating systems, file systems, applications, etc.) may be housed in or loaded onto a computing device and the storage devices 140, 165 may be operated externally of the computing device. In a distributed computing environment (sometimes referred to as a cloud computing environment), the data storage devices may be operated at one or more datacenters that are operated and maintained remotely from the other components of the storage system 100.

Figure 2A:
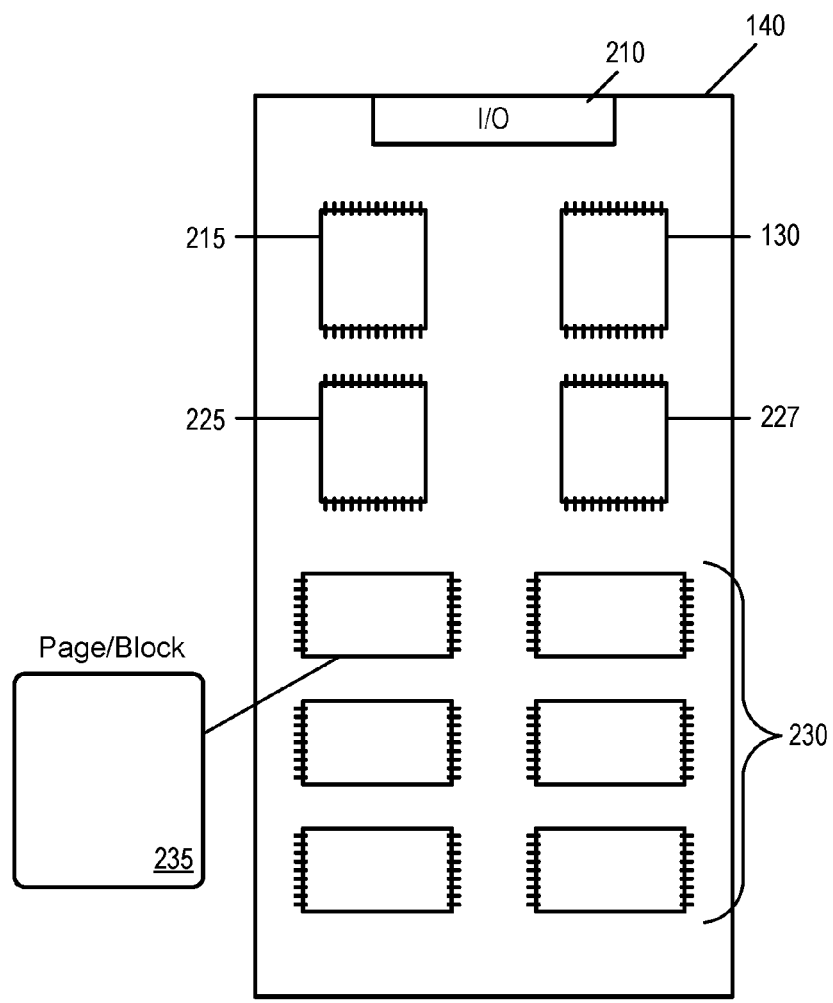
FIG. 2A is a block diagram of a solid state storage device or system.

Referring now to FIG. 2A, an internal view of a typical solid state memory device 140 is provided, illustrating various components of the solid state memory device 140. An input/output device or module 210 is illustrative of an input/output interface with which the SSD device 140 is operatively connected to a storage device driver layer 125 for data input and output to and from the SSD 140. The SSD controller 130 is illustrated as an integrated circuit chip or card mounted inside the SSD device 140 for controlling the operations of the SSD device 140, as described above. A cache chip or card 215 is illustrative of a solid state chip or card contained in the solid state memory device 140 for temporarily storing instructions to and from the SSD controller 130 and for temporarily storing data input to the SSD device 140 or output from the device 140 in association with read/write operations to persistent storage cards 230, described below.

A wear-leveling chip or card 227 is illustrative of a control component or storage component on which information and control logic may be maintained and operated by the control chip or card 130 for performing wear-leveling operations with respect to the data pages/blocks 235 contained in the one or more storage cards/chips 230. The channel scheduler card/chip 225 is illustrative of a device, device firmware, or software application operative to schedule data writes to various SSD storage/Flash chips 230 and for handling data parallelism in the SSD device 140. As known to those skilled in the art, channels refer to the number of storage chips 230 the controller 130 can communicate with simultaneously, where different levels of SSDs have different numbers of channels (e.g., low level SSDs—2 or 4 channels; high level SSDs—8 or 10 channels). The channel scheduler 225 may assist the host layer or storage device in scheduling and/or controlling data writes through the channels of the SSD, including parallel data writes.

The flash storage cards/chips 230 are illustrative of a plurality or array of solid state chips or cards stored inside the solid state memory device 140 onto which data is stored, read, written to, and erased at the direction of the controller 130. The page/block 235 is illustrative of an individual storage zone contained on one of the flash cards 230 at which data may be stored, read from, or erased, as described herein.

According to aspects of the present disclosure, the storage cards/chips 230 are illustrative of a NAND flash array that is present in typical SSD storage devices. As is well known to those skilled in the art, such SSD storage devices are comprised of pages, blocks, planes, and die(s). One page holds 4 kb of memory capacity, and reading and writing is performed on a page basis. One block is comprised of 64 pages, and erasure is only performed on a block basis. One plane is comprised of 2048 blocks, and one die is comprised of four planes.

Figure 2B:
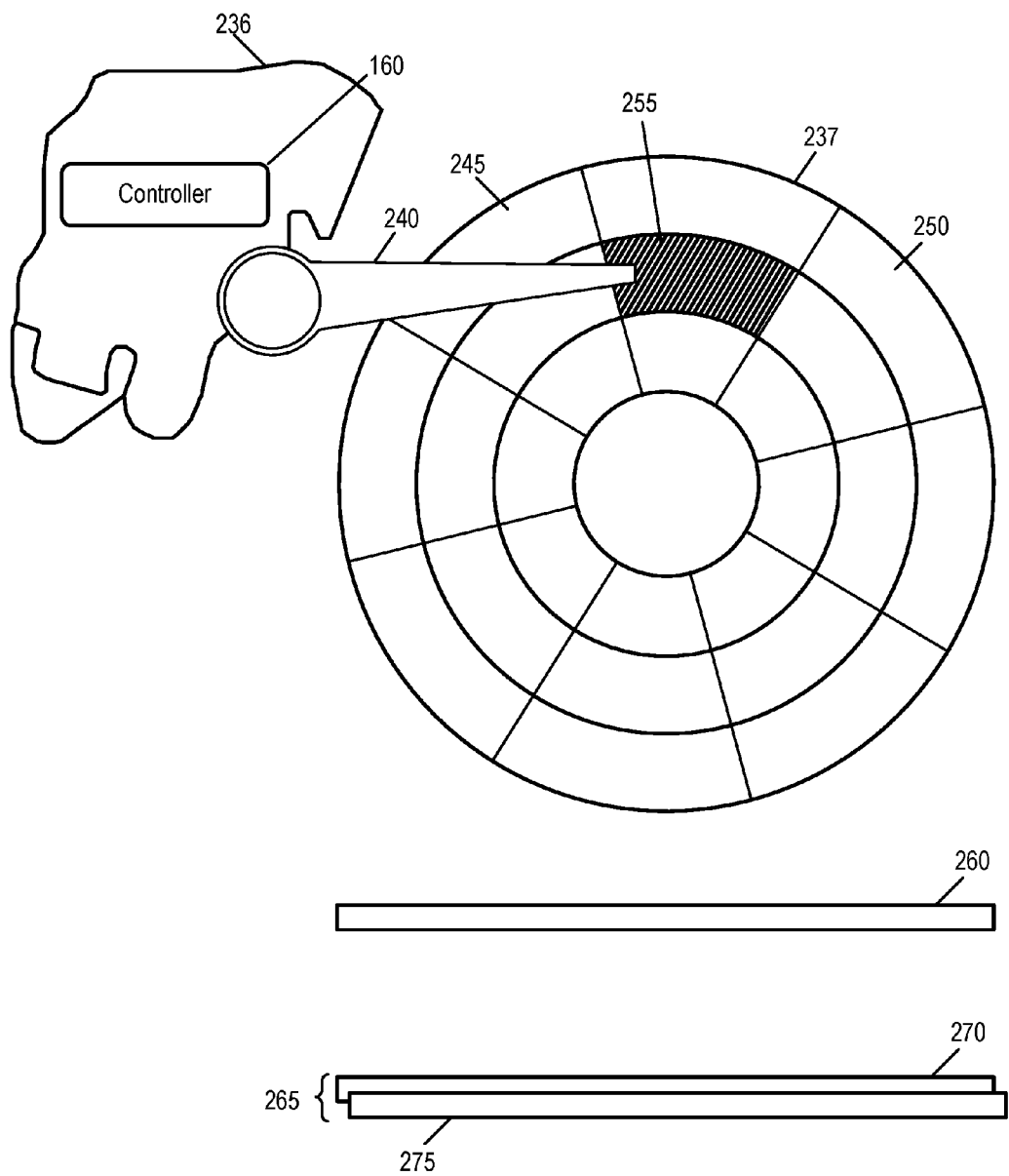
FIG. 2B is a block diagram of components of a typical hard disk storage device.
Figure 3:
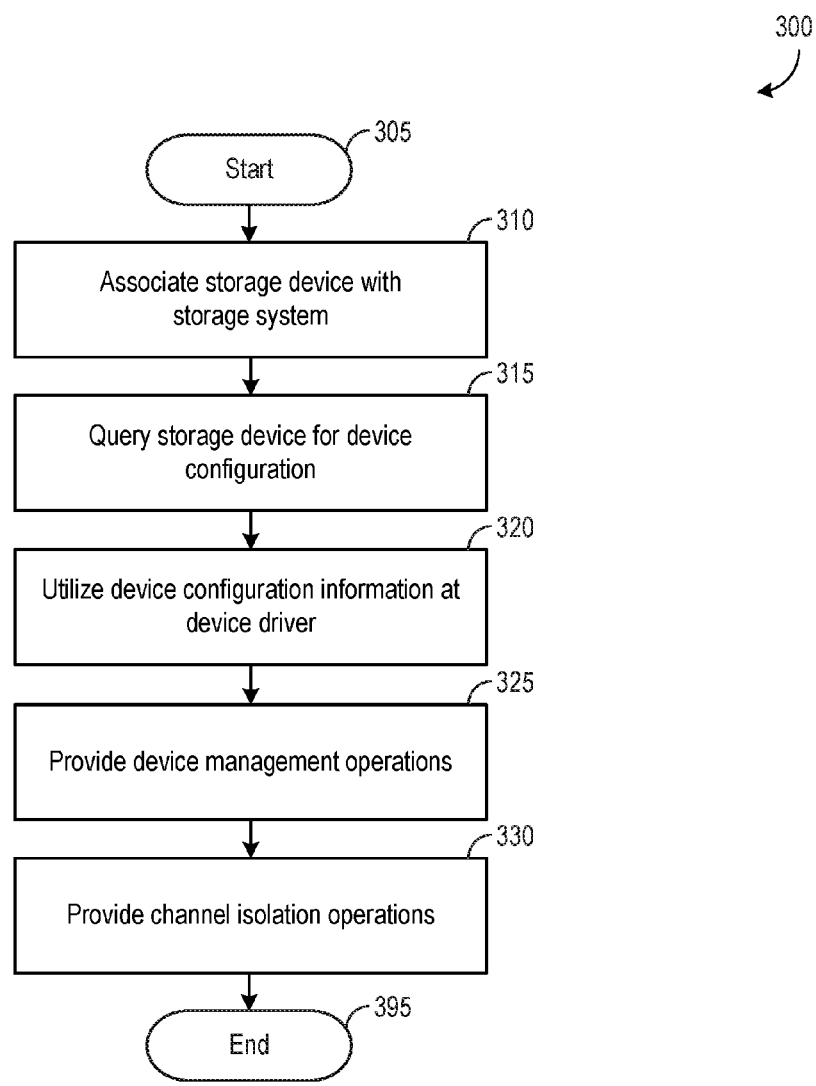
FIG. 3 is a flow chart showing general stages involved in an example method for improving the utilization of storage stack architecture for many-log structured media.

Referring now to FIG. 2B, components of a typical hard disk drive 165 are illustrated and described. Portions of a control unit 236 are illustrated in which is maintained the controller 160 for performing control operations designated for the storage device level as part of the improved interface between the host layer and the storage device layer, as described herein and in similar manner as described above for the SSD 140. A hard disk or platter 237 is illustrated that is divided into a number of tracks and sectors 250 that are further divided into sector zones 245, 255 onto which data may be stored through a control actuator arm and read/write head 240 operatively connected to the disk or platter 237 from the control unit 236. Operation of components of a hard disk drive storage device 165 is well known to those skilled in the art.

Referring still to FIG. 2B, beneath the example hard disk platter 237 a bar 260 illustrates traditional non-overlapping storage on a hard disk platter 237 where data is stored in tracks parallel to each other in a non-overlapping fashion. The overlapping bars 265 illustrate shingled magnetic recording (SMR) storage with which tracks of data may be written in overlapping fashion, where a first track 270 may partially overlap a second track 275 for increasing storage density on the associated platter 237. Shingled magnetic recording (SMR) devices and methods are well known to those skilled in the art.

As briefly described above, according to aspects of the present disclosure, operations of a variety of components of the storage system stack are redefined to make the system more efficient when the underlying media has a "multi-log" type interface such as the case with NAND flash SSD memory or shingled magnetic recording media. The responsibilities of components of the storage system stack are modified such that each responsibility is performed at the most efficient component (level of abstraction) of the storage stack.

According to one aspect, the storage device configuration of the present disclosure may look like a raw NAND configuration where one or more external controllers manage the internal activities of the storage device. However, according to aspects of the present disclosure, the improved software stack (illustrated in FIG. 1) further defines the operation of the SSD 140 beyond a definition that may apply to a raw NAND device.

According to the interface between the host layer and the SSD device 140, much of the management of the SSD device 140 is placed at the device driver layer 125 as opposed to prior systems having such management activities in the flash translation layer 135. For example, according to the present system, the device driver layer 125 is responsible for directing the channel scheduler for scheduling read/write operations along one or more channels.

Accordingly, the operation of the SSD 140 of the present disclosure may operate as a hybrid system relative to the rest of the storage stack (illustrated in FIG. 1). According to some prior systems, all operations of the SSD 140, including ECC, fine and course inner-channel wear-leveling, bad block mapping, bus scheduling, and the like are pushed up to the software stack (e.g., to the file system) and the SSD 140 is treated more like raw NAND. On the other hand, some prior systems keep almost all media management operations locally in the SSD 140 which can lead to performance issues because the driver layer does not always know about the activities or timing of performance for the SSD 140. This can also lead to awkward design because the software stack must be changed for each new drive architecture, and the same stack would not work for SSDs and SMRs.

As described herein, according to aspects of the present disclosure, an improved interface (e.g., block allocator 128) between the storage system host layer and storage system device media includes changes to the types and sequences of commands being sent from the host layer (e.g., device driver layer) to the storage devices 140, 165 via the SSD controller 130 and flash transition layer 135 (for SSDs) and the controller 160 for HDDs. As understood by those skilled in the art, the host layer typically does not know or understand the activities of the storage medium (140, 165) software or firmware, and as a result, spikes in storage latency may be experienced. In addition, undesired writing (write amplification) to memory may be problematic, particularly for SSD devices that have limited lifetimes. In some cases, write amplification to the storage medium can be on the order of five times (5×), such that every time a host orders a write to a drive, five actual writes may be made to the medium for each one write required. For another example, when multiple tenants are associated with a given storage medium, storage activities for each of the multiple tenants may interfere with each other, owing to a difficulty in isolating behavior of any individual tenant from other tenants. Thus, the aggregated effects of storage performance problems associated with each of the multiple tenants create even larger performance problems for the data storage system.

In terms of the types of commands and operations distributed between the host layer and the storage device layer, according to one aspect of the present disclosure, greater manageability of data storage operations is realized by providing more storage operation control to the storage system host layer via an improved interface (e.g., block allocator 128) between the host layer, including the device driver layer, and the storage media layer (140, 165). For example, data storage management operations such as logical to physical address translation and garbage collection are controlled at the host layer (e.g., at the device driver 125 or file system 115) which will give the host layer control over when such operations occur. That is, by having the host layer control the scheduling and performance of such operations, such problems as storage latency may be improved because the host layer can de-conflict the performance of such operations with other required operations to reduce overburdening the storage device with operations at times when the storage device is already tasked with one or more other operations.

According to another aspect, by improving the interface between the host layer and the storage devices, not only is a more modular approach to data storage provided with respect to placing more of the management activities at the host layer as described above, but in addition, instead of buffering small data writes from arbitrary workloads, large characterization and qualification efforts associated with new storage media may be maintained at the device driver layer, and data writes may be directed to the storage devices (media) by the host layer in a sequential manner rather than buffering followed by large wholesale write operations.

According to one example operation, an improved interface (e.g., block allocator 128) to a memory storage device 140, 165 exposes the logical semantics of the device media to the host device or software while maintaining a leaner set of device management operations including logical to physical storage media mapping, data encryption, error-correcting code (ECC) operations, bad block mapping, wear-leveling, garbage collection, read and write caching, etc. According to one example, the host device or system writes sequentially within a given hard drive zone or sector or SSD block or page. The host device or system trims or erases entire blocks or zones in a single erasure operation. The host device or system may read the storage devices randomly, and the host device or system may read and write at the granularity of the medium to which reading and writing are directed according to the granularity that the target medium is capable of, for example, a flash page in a SSD flash storage device. According to another example, according to the improved interface between the host device or system and the storage medium, the host is not required to handle a variety of storage media management operations as those operations may be pushed down to the interface between a drive layer and associated storage media.

Continuing with a discussion of the types of commands between the host (driver device layer) and the storage devices, operations of various storage device management functions may be divided among storage system components for causing data storage to be more efficient and consistent. For example, according to aspects, wear-leveling operations may be maintained at the storage device level, because while SSD devices require wear-leveling operations, hard disk drive (or SMR) storage systems do not. Thus, wear-leveling operations are maintained at the storage device level rather than moving those operations to the host level, which may not need to perform wear-leveling operations depending on the storage device type.

According to prior systems, much if not all of data storage management operations is/are maintained and directed from the host layer, regardless of the type of data storage device being utilized. According to aspects of the present disclosure, those data storage and management functions that are applicable to all data storage types may be maintained and operated from the host layer where those data storage or management functions that are particular to a given type of storage device (e.g., SSD) are maintained and operated at the device level. For example, power off/power on data retention management functions would be maintained and operated at the storage device. Similarly, error correction code (ECC) operations would be maintained and operated at the storage device. Thus, by maintaining data storage management operations at the host layer that are applicable to all types of data storage devices, the host layer data storage management instructions do not have to be modified and rewritten each time a different type of data storage device is added to the storage system 100. Because data storage management instructions specifically applicable to each type of data storage device will be maintained and operated at the data storage device, the host layer does not have to be burdened with device management operations that are only applicable to some but not all devices to which data may be stored.

Improving the sequence of commands between the host layer and the storage device layer improves storage performance and device endurance. In terms of performance as a function of the sequence of commands between the host layer and the storage device layer, consider, for example, that for a single user writing data to storage sequentially, the write operation is very fast for the storage drive. However, for multiple users, for example, four users, each writing data to storage sequentially, the data write operations begin to be made to the drive randomly and slowly. According to aspects of the present disclosure, the data writes for each of the multiple users are separated, such that the data write operations may be speeded up for each of the individuals comprising the multiple users.

According to another aspect of the present disclosure, by improving the interface between the storage system drive layer (host) and the storage system media layer (140, 165), the endurance of storage media is improved. Continuing with the above example of four different users writing data to the same storage device, by keeping the data write operations separate for each of the users, write amplification is eliminated, for example, where the write amplification drops from 4-5 data writes to one (1).

According to aspects of the present disclosure, many of the management activities are placed at the driver layer, which allows the driver layer to be configured as a single configuration point for various types of storage devices to which it may be associated. Such an architecture also promotes and allows innovation by device driver developers who may improve the functionality of the device driver layer without having to effect changes to each storage device.

According to another aspect, the determination as to when a block is ready for erasure is a shared responsibility of the host layer (device driver 125) and the SSD 140. That is, the host layer may de-allocate the block and then the storage device has the choice of when to erase the block. Different de-allocation/erasure policies may be set on the interface between the host layer and the storage device.

For example, according to one policy, when the host layer deallocates a block, the storage device erases the block immediately before operation returns to the host. According to another policy, during reallocation by the host, when the host layer indicates it is going to allocate a block, but there are no currently available erase blocks, then the storage device must do an immediate erase of a previously de-allocated block. According to another policy, when the storage device detects idleness (no current read/write/erase operations) in the array, it can choose to erase de-allocated but not erased blocks during the idle period. Thus, the de-allocation and erase operations are constructive operations between the host layer and the device layer.

According to another aspect, a given storage device 140, 165 may expose to the host layer or file system information about its architecture on a per block or zone, or a per multiple block or multiple zone basis. For example, a given storage device 140, 165 may periodically expose to the file system information on its blocks or zones, allocations, channel information, and the like.

Logical block addresses (LBA) specify the locations on the storage devices 140, 165 at which blocks of data are stored. Different LBAs may serve as potential starting addresses for data writes. In the case of a new (never written-to) medium, a write sequence includes allocation of a storage unit (e.g., block or zone), followed by the file system 115 ordering a write from the beginning of that unit to the end in a sequential write operation. Alternatively, the file system 115 can start anywhere in the unit, followed by writing sequentially, but according to this aspect, it is advantageous to provide management control at a layer between the file system and the storage device to reject any writes that come at the storage unit border.

In the case of a new medium after a small, single logical sector write (e.g., 512 bytes), according to an aspect of the disclosure, small writes may be temporarily cached, for example, in the cache 215, illustrated in FIG. 2A. A management instruction is configured in the channel scheduler 225, or alternatively, in a driver layer 125, that recognizes the small write is too small to push through to the storage device 140, 165, and thus, the small write is cached and is collected with other small writes until enough writable data for a whole writable unit size is collected. The collection of small writes may then be passed to the storage device 140, 165. In this case, the storage device need only expose an API to the designated management layer (scheduler or driver layer) to allow that layer to know what the whole unit size is, to allow the management layer to track the collection of small writes.

In the case of a storage medium where each logical sector has been written to once, the choice/decision as to where to write to next is at the block level. The storage device chooses which block to send up to the low-level device driver 125 on allocation and then at that point the device driver will decide which block to choose. For example, according to one aspect, the channel scheduler 225 narrows the field of options, and the wear-leveler 227 makes the final choice based on wear, defaulting to round-robin selection (i.e., select the next available option). In some aspects, where the scheduler 225 has set too many constraints (for example, a given channel has allocated all its blocks), the wear-leveler 227 is operable to "back pressure" the scheduler 225, telling it either to free some blocks or allow for selection from another channel. Alternatively, in the case of SSD 140, the wear-leveler 227 may choose the block based on distribution of wear. If no such constraint is in place, the block choice may be simply a next block on a list after the last block previously chosen.

According to one aspect, if a write operation begins partially through a block or zone, for example in a 64 megabyte zone where a first write of 32 megabytes is performed followed by a command to write another 64 megabytes of data, the file system 115 will allocate two zones, so that it will have enough space for all the writes. That is, the file system 115 will not allow the writes to span across the two blocks or zones.

According to another aspect, performance cross-channel isolation may also be performed at the direction of the host layer (file system 115 or device driver 125). Isolation between the storage device channels may be performed by the channel scheduler 225. In this case, the channel scheduler 225 communicates with the file system 115 about channel isolation and policy use. For example, the channel scheduler 225 might communicate that a particular application 105 allocating a set of allocation units needs to stay isolated from another application. In addition, there can be varying and different degrees of isolation. For example, some applications cannot share any channels; some applications cannot share planes, and the like. And, in terms of other operations, for example moving from a fine granularity wear leveling to a more coarse granularity wear leveling, where wear leveling is only done once per week or month, the interface between the host and the storage devices, as well as, other components of the storage stack described herein may ensure that the rebalancing of applications in terms of the cross channel isolation policies are met while ensuring that all planes are evenly distributed for wear leveling purposes.

According to an aspect, the storage device provides the ordered isolation based on well-defined guarantees based solely on how the media operate. For example, in the case of a Flash SSD having an array of NAND chips, there may be on the order of eight different channels, each channel having four die(s), and each die having four planes. Each of these levels in the hierarchy has its own types of guarantees. So, for example, if data is written to bus 1 and then data is written to bus 3, those two writes will not interfere with each other. If data is written to the same bus, the same die, and two different planes, then those two operations can proceed at the same time, but they have to be started in the same operation. According to aspects of the present disclosure, information about these isolations is exposed outside of the storage drive for the channel scheduler and the device driver to work utilize in management of the storage device.

According to another aspect, performance of applications 105 that rely on the storage stack 100 for data storage operations experience improved performance owing to the improved storage stack operations described herein. For example, if multiple applications are directing multiple files for storage to the storage stack 100, where each of the multiple files try to write to media sequentially, they tend to get mixed up at the storage media, resulting in increased garbage collection. In such a case, if the applications are constantly interfacing with the storage media, then performance of application input/output will be slowed (possibly considerably). According to aspects of the present disclosure, by keeping each of the different files separated at the storage media, there will be very little garbage collection processing overhead because the appends to the end of the log invalidate the earlier items in the log so that data does not have to get moved around during garbage collection processing.

Having described an example storage system architecture and various aspects of the present disclosure above with reference to FIGS. 1, 2A and 2B, FIG. 3 is a flow chart showing general stages involved in an example method for improving the utilization of storage stack architecture for many-log structured media. For purposes of explanation of FIG. 3, consider an example operation of adding a storage device 140, 165 to a computer (FIG. 4, 5A, 5B) for use in data storage operations with respect to one or more applications 105 operating on the computer. The method 300 begins at start operation 305 and proceeds to operation 310 where a storage device 140, 165 is associated with a user's computer 400, 500. For example, the storage device may be a new hard drive 165 added to the computer to replace a defective drive. For another example, the storage device may be an external hard drive plugged into the computer via a universal serial bus (USB) connector. For another example, the storage device may be an internal SSD device 140 added to the computer. For another example, the storage device may be a USB type Flash drive plugged into the computer.

At operation 315, the host layer, for example, the device driver 125, queries the added storage device and requests various configuration information items for the device. For example, the host layer may query the device for the device zone or block sizes, the write unit sizes, the number of channels, and the like.

At operation 320, the host layer utilizes the queried device information to set the device up with the file system 115, for example, to initialize the device's configuration parameters with the file system 115 so that the file system 115 can manage memory allocations on the added storage device. For example, if the added device reports a zone size of four (4) megabytes, then the file system 115 knows that it can allocate up to 4 megabytes of memory space for data storage and management operations. At operation 320, if any formatting of the storage device is ordered, either by user command or file system or device driver command, the added storage device may be formatted as ordered, and any post-formatting configuration data may be queried from the storage device back to the device driver layer (host layer).

At operation 325, data storage and management operations are allocated to the added storage device, to the low level host layer and to the file system to achieve the most efficient use of the storage stack 100. For example, if the added storage device is an SSD device 140 and all other storage devices associated with the computer are HDD devices 165, then SSD-specific management functions such as wear leveling will be assigned to the added SSD device 140. Other functions that are most effectively performed at the host layer, for example, memory allocation functions are assigned to the host layer.

At operation 330, channel isolation operations are performed as needed, as described herein. For example, whether the storage device is doing garbage collection and/or other cleaning, the file system 115 and/or the host layer has a fully developed mapping for the added device. Consider that the storage system stack at the direction of the file system 115 or device driver and system wants to provide an application 105 the ability to isolate the performance of two different files (file 1 and file 2). Consider that the application 105 wants file 1 to become completely isolated in performance from files (e.g., file 2). According to an aspect, file 1 is designated for isolation and all zones from channel 1 are selected for file 1 and all zones from channel 2 are selected for file 2. If file 1 receives a lot of writes compared to file 2, then channel 1 is writing out at a faster rate than channel 2. As a result, the channel scheduler 225 monitors the two channels in terms of write traffic to each channel. The channel scheduler 225 may then advise file 1 or file 2, and may take an action to perform load balancing. According to one aspect, the scheduler 225 may migrate the two files (i.e., inter-channel wear-leveling by swapping the two channels—file 1 to channel 2 and file 2 to channel 1), followed by notifying the file system 115 that the migration has occurred, so that the file system 115 may change the mappings for each of the two files. According to another aspect, the scheduler 225 may simply track statistics about inter-channel use, and provide them to the storage system (i.e., file system, database, key-value store, etc.) upon request. At this point, the storage system may load balance by assigning more files to the lesser-used channel(s).

The method ends at operation 395.

While implementations have been described in the general context of program modules that execute in conjunction with an application program that runs on an operating system on a computer, those skilled in the art will recognize that aspects may also be implemented in combination with other program modules. Generally, program modules include routines, programs, components, data structures, and other types of structures that perform particular tasks or implement particular abstract data types.

The aspects and functionalities described herein may operate via a multitude of computing systems including, without limitation, desktop computer systems, wired and wireless computing systems, mobile computing systems (e.g., mobile telephones, netbooks, tablet or slate type computers, notebook computers, and laptop computers), handheld devices, multiprocessor systems, microprocessor-based or programmable consumer electronics, minicomputers, and mainframe computers.

In addition, according to an aspect, the aspects and functionalities described herein operate over distributed systems (e.g., cloud-based computing systems), where application functionality, memory, data storage and retrieval and various processing functions are operated remotely from each other over a distributed computing network, such as the Internet or an intranet. According to an aspect, user interfaces and information of various types are displayed via on-board computing device displays or via remote display units associated with one or more computing devices. For example, user interfaces and information of various types are displayed and interacted with on a wall surface onto which user interfaces and information of various types are projected. Interaction with the multitude of computing systems with which implementations are practiced include, keystroke entry, touch screen entry, voice or other audio entry, gesture entry where an associated computing device is equipped with detection (e.g., camera) functionality for capturing and interpreting user gestures for controlling the functionality of the computing device, and the like.

Figure 4:
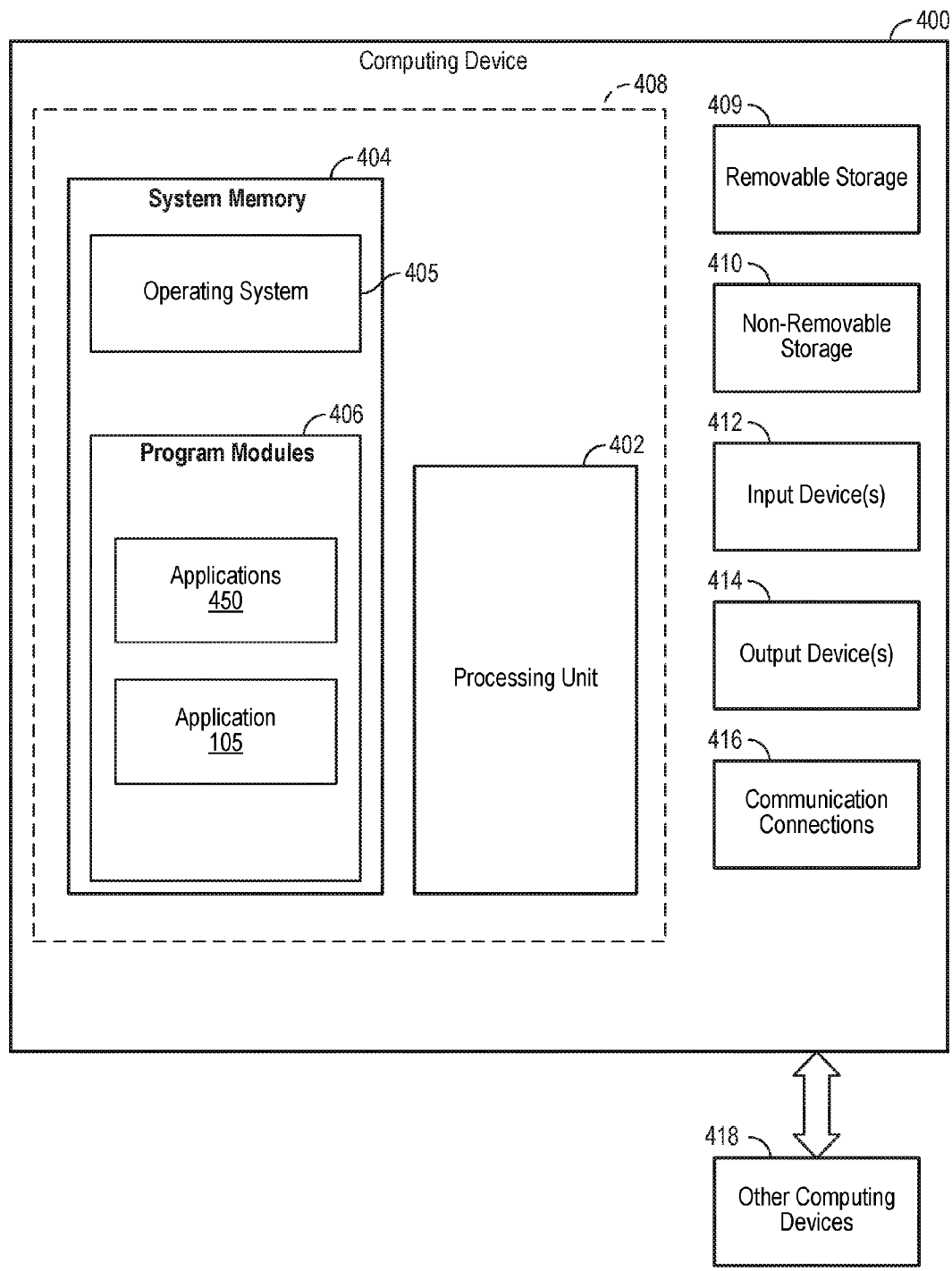
FIG. 4 is a block diagram illustrating example physical components of a computing device.
Figure 5A:
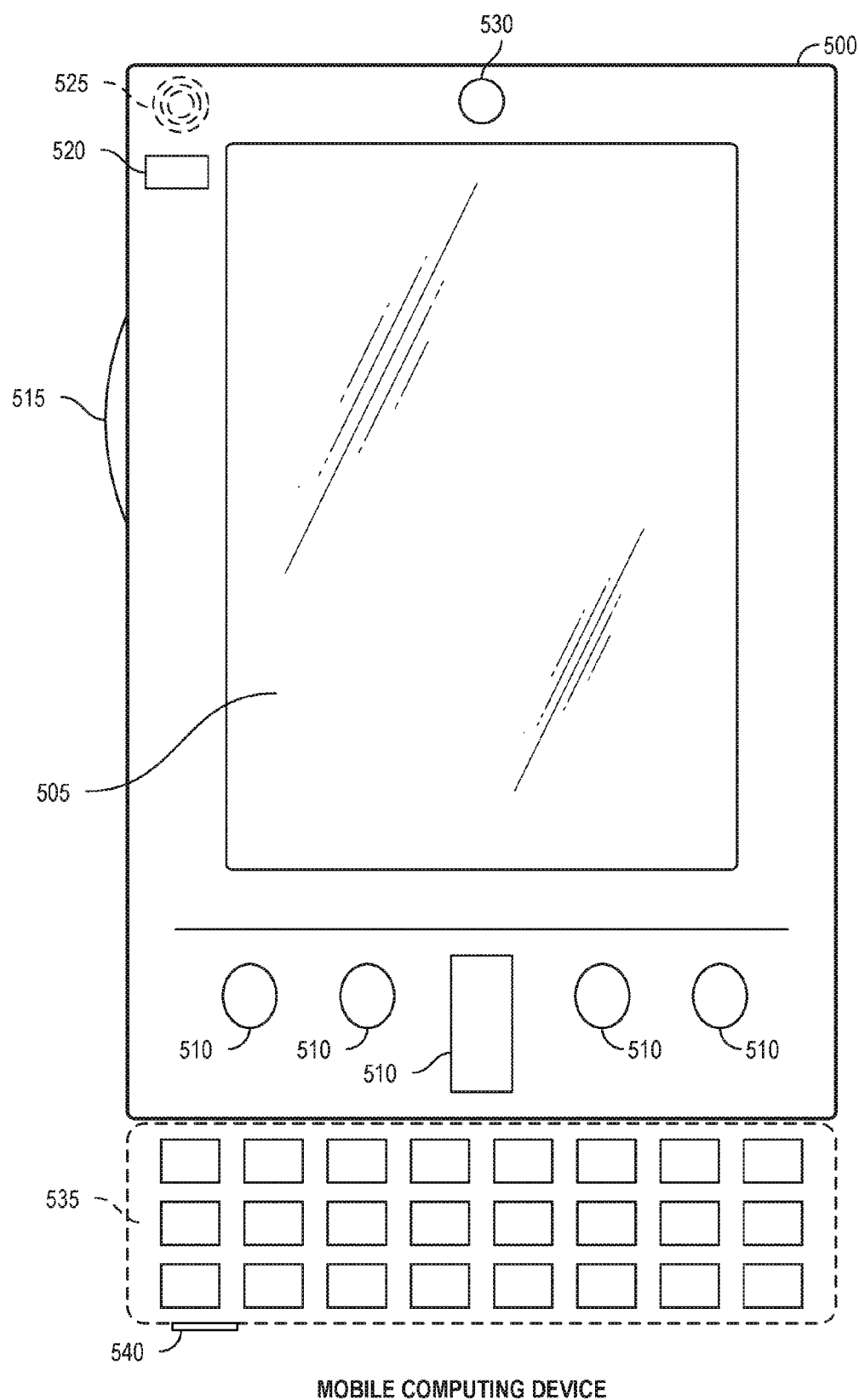
FIGS. 5A and 5B are block diagrams illustrating example physical components of a mobile computing device.
Figure 5B:
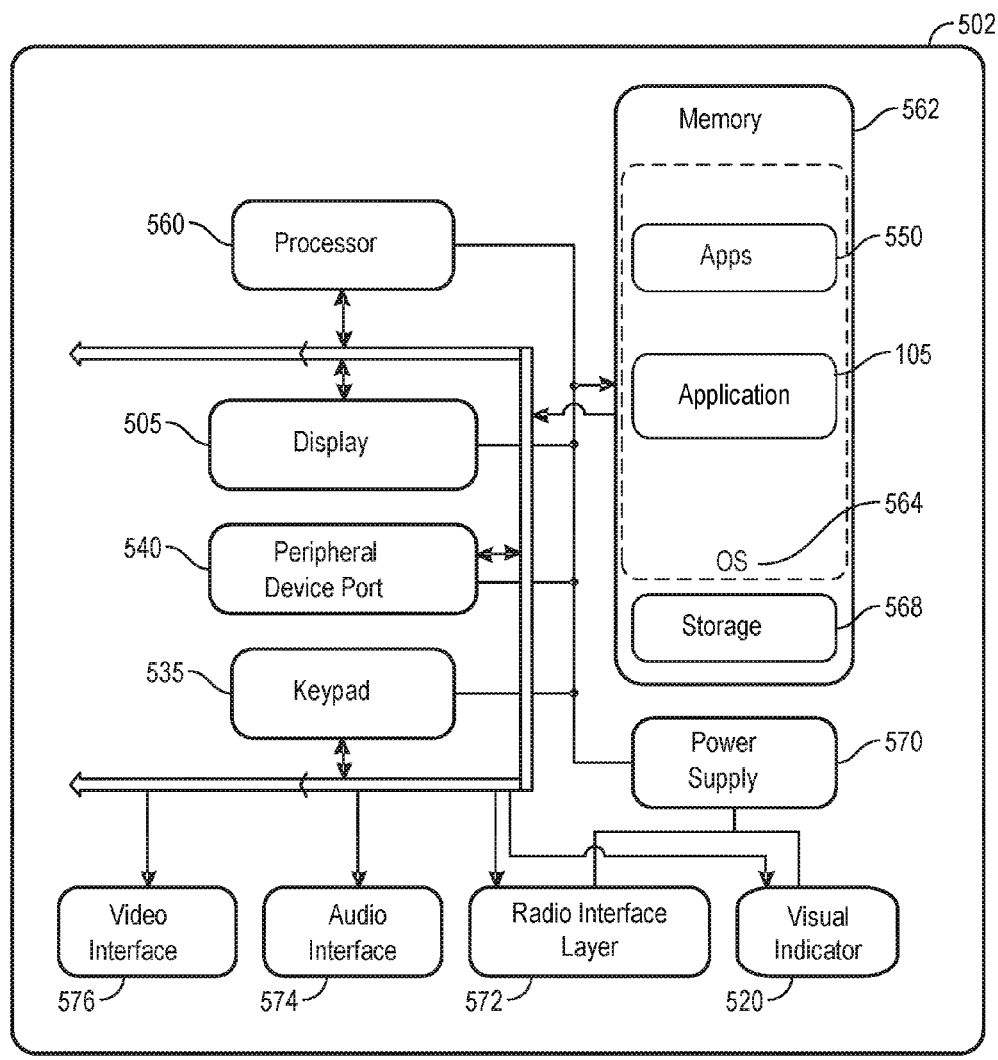

FIGS. 4, 5A and 5B and the associated descriptions provide a discussion of a variety of operating environments in which examples are practiced. However, the devices and systems illustrated and discussed with respect to FIGS. 4, 5A and 5B are for purposes of example and illustration and are not limiting of a vast number of computing device configurations that are utilized for practicing aspects, described herein.

FIG. 4 is a block diagram illustrating physical components (i.e., hardware) of a computing device 400 with which examples of the present disclosure are be practiced. In a basic configuration, the computing device 400 includes at least one processing unit 402 and a system memory 404. According to an aspect, depending on the configuration and type of computing device, the system memory 404 comprises, but is not limited to, volatile storage (e.g., random access memory), non-volatile storage (e.g., read-only memory), flash memory, or any combination of such memories 140, 165. According to an aspect, the system memory 404 includes an operating system 405 and one or more program modules 406 suitable for running software applications 105, 450. The operating system 110, 405, for example, is suitable for controlling the operation of the computing device 400. Furthermore, aspects are practiced in conjunction with a graphics library, other operating systems, or any other application program, and are not limited to any particular application or system. This basic configuration is illustrated in FIG. 4 by those components within a dashed line 408. According to an aspect, the computing device 400 has additional features or functionality. For example, according to an aspect, the computing device 400 includes additional data storage devices (removable and/or non-removable) such as, for example, magnetic disks, SSDs, HDDs, optical disks, or tape. Such additional storage is illustrated in FIG. 4 by a removable storage device 409 and a non-removable storage device 410.

As stated above, according to an aspect, a number of program modules and data files are stored in the system memory 404. While executing on the processing unit 402, the program modules 406 perform processes including, but not limited to, one or more of the stages of the method 300 illustrated in FIG. 3. According to an aspect, other program modules are used in accordance with examples and include applications such as electronic mail and contacts applications, word processing applications, spreadsheet applications, database applications, slide presentation applications, drawing or computer-aided application programs, etc.

According to an aspect, aspects are practiced in an electrical circuit comprising discrete electronic elements, packaged or integrated electronic chips containing logic gates, a circuit utilizing a microprocessor, or on a single chip containing electronic elements or microprocessors. For example, aspects are practiced via a system-on-a-chip (SOC) where each or many of the components illustrated in FIG. 4 are integrated onto a single integrated circuit. According to an aspect, such an SOC device includes one or more processing units, graphics units, communications units, system virtualization units and various application functionality all of which are integrated (or "burned") onto the chip substrate as a single integrated circuit. When operating via an SOC, the functionality, described herein, is operated via application-specific logic integrated with other components of the computing device 400 on the single integrated circuit (chip). According to an aspect, aspects of the present disclosure are practiced using other technologies capable of performing logical operations such as, for example, AND, OR, and NOT, including but not limited to mechanical, optical, fluidic, and quantum technologies. In addition, aspects are practiced within a general purpose computer or in any other circuits or systems.

According to an aspect, the computing device 400 has one or more input device(s) 412 such as a keyboard, a mouse, a pen, a sound input device, a touch input device, etc. The output device(s) 414 such as a display, speakers, a printer, etc. are also included according to an aspect. The aforementioned devices are examples and others may be used. According to an aspect, the computing device 400 includes one or more communication connections 416 allowing communications with other computing devices 418. Examples of suitable communication connections 416 include, but are not limited to, radio frequency (RF) transmitter, receiver, and/or transceiver circuitry; universal serial bus (USB), parallel, and/or serial ports.

The term computer readable media as used herein include computer storage media. Computer storage media include volatile and nonvolatile, removable and non-removable media implemented in any method or technology for storage of information, such as computer readable instructions, data structures, or program modules. The system memory 404, the removable storage device 409, and the non-removable storage device 410 are all computer storage media examples (i.e., memory storage.) According to an aspect, computer storage media includes RAM, ROM, electrically erasable programmable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 400. According to an aspect, any such computer storage media is part of the computing device 400. Computer storage media does not include a carrier wave or other propagated data signal.

According to an aspect, communication media is embodied by computer readable instructions, data structures, program modules, or other data in a modulated data signal, such as a carrier wave or other transport mechanism, and includes any information delivery media. According to an aspect, the term "modulated data signal" describes a signal that has one or more characteristics set or changed in such a manner as to encode information in the signal. By way of example, and not limitation, communication media includes wired media such as a wired network or direct-wired connection, and wireless media such as acoustic, radio frequency (RF), infrared, and other wireless media.

FIGS. 5A and 5B illustrate a mobile computing device 500, for example, a mobile telephone, a smart phone, a tablet personal computer, a laptop computer, and the like, with which aspects may be practiced. With reference to FIG. 5A, an example of a mobile computing device 500 for implementing the aspects is illustrated. In a basic configuration, the mobile computing device 500 is a handheld computer having both input elements and output elements. The mobile computing device 500 typically includes a display 505 and one or more input buttons 510 that allow the user to enter information into the mobile computing device 500. According to an aspect, the display 505 of the mobile computing device 500 functions as an input device (e.g., a touch screen display). If included, an optional side input element 515 allows further user input. According to an aspect, the side input element 515 is a rotary switch, a button, or any other type of manual input element. In alternative examples, mobile computing device 500 incorporates more or less input elements. For example, the display 505 may not be a touch screen in some examples. In alternative examples, the mobile computing device 500 is a portable phone system, such as a cellular phone.

According to an aspect, the mobile computing device 500 includes an optional keypad 535. According to an aspect, the optional keypad 535 is a physical keypad. According to another aspect, the optional keypad 535 is a "soft" keypad generated on the touch screen display. In various aspects, the output elements include the display 505 for showing a graphical user interface (GUI), a visual indicator 520 (e.g., a light emitting diode), and/or an audio transducer 525 (e.g., a speaker). In some examples, the mobile computing device 500 incorporates a vibration transducer for providing the user with tactile feedback. In yet another example, the mobile computing device 500 incorporates input and/or output ports, such as an audio input (e.g., a microphone jack), an audio output (e.g., a headphone jack), and a video output (e.g., a HDMI port) for sending signals to or receiving signals from an external device. In yet another example, the mobile computing device 500 incorporates peripheral device port 540, such as an audio input (e.g., a microphone jack), an audio output (e.g., a headphone jack), and a video output (e.g., a HDMI port) for sending signals to or receiving signals from an external device.

FIG. 5B is a block diagram illustrating the architecture of one example of a mobile computing device. That is, the mobile computing device 500 incorporates a system (i.e., an architecture) 502 to implement some examples. In one example, the system 502 is implemented as a "smart phone" capable of running one or more applications (e.g., browser, e-mail, calendaring, contact managers, messaging clients, games, and media clients/players). In some examples, the system 502 is integrated as a computing device, such as an integrated personal digital assistant (PDA) and wireless phone.

According to an aspect, one or more application programs 550 are loaded into the memory 562 and run on or in association with the operating system 564. Examples of the application programs include phone dialer programs, e-mail programs, personal information management (PIM) programs, word processing programs, spreadsheet programs, Internet browser programs, messaging programs, and so forth. The system 502 also includes a non-volatile storage area 568 (SDDs and/or HDDs) within the memory 562. The non-volatile storage area 568 is used to store persistent information that should not be lost if the system 502 is powered down. The application programs 105, 550 may use and store information in the non-volatile storage area 568, such as e-mail or other messages used by an e-mail application, and the like. A synchronization application (not shown) also resides on the system 502 and is programmed to interact with a corresponding synchronization application resident on a host computer to keep the information stored in the non-volatile storage area 568 synchronized with corresponding information stored at the host computer. As should be appreciated, other applications may be loaded into the memory 562 and run on the mobile computing device 500.

According to an aspect, the system 502 has a power supply 570, which is implemented as one or more batteries. According to an aspect, the power supply 570 further includes an external power source, such as an AC adapter or a powered docking cradle that supplements or recharges the batteries.

According to an aspect, the system 502 includes a radio 572 that performs the function of transmitting and receiving radio frequency communications. The radio 572 facilitates wireless connectivity between the system 502 and the "outside world," via a communications carrier or service provider. Transmissions to and from the radio 572 are conducted under control of the operating system 564. In other words, communications received by the radio 572 may be disseminated to the application programs 550 via the operating system 564, and vice versa.

According to an aspect, the visual indicator 520 is used to provide visual notifications and/or an audio interface 574 is used for producing audible notifications via the audio transducer 525. In the illustrated example, the visual indicator 520 is a light emitting diode (LED) and the audio transducer 525 is a speaker. These devices may be directly coupled to the power supply 570 so that when activated, they remain on for a duration dictated by the notification mechanism even though the processor 560 and other components might shut down for conserving battery power. The LED may be programmed to remain on indefinitely until the user takes action to indicate the powered-on status of the device. The audio interface 574 is used to provide audible signals to and receive audible signals from the user. For example, in addition to being coupled to the audio transducer 525, the audio interface 574 may also be coupled to a microphone to receive audible input, such as to facilitate a telephone conversation. According to an aspect, the system 502 further includes a video interface 576 that enables an operation of an on-board camera 530 to record still images, video stream, and the like.

According to an aspect, a mobile computing device 500 implementing the system 502 has additional features or functionality. For example, the mobile computing device 500 includes additional data storage devices (removable and/or non-removable) such as, magnetic disks, optical disks, or tape. Such additional storage is illustrated in FIG. 5B by the non-volatile storage area 568.

According to an aspect, data/information generated or captured by the mobile computing device 500 and stored via the system 502 is stored locally on the mobile computing device 500, as described above. According to another aspect, the data is stored on any number of storage media that is accessible by the device via the radio 572 or via a wired connection between the mobile computing device 500 and a separate computing device associated with the mobile computing device 500, for example, a server computer in a distributed computing network, such as the Internet. As should be appreciated such data/information is accessible via the mobile computing device 500 via the radio 572 or via a distributed computing network. Similarly, according to an aspect, such data/information is readily transferred between computing devices for storage and use according to well-known data/information transfer and storage means, including electronic mail and collaborative data/information sharing systems.

Implementations, for example, are described above with reference to block diagrams and/or operational illustrations of methods, systems, and computer program products according to aspects. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more examples provided in this application are not intended to limit or restrict the scope as claimed in any way. The aspects, examples, and details provided in this application are considered sufficient to convey possession and enable others to make and use the best mode. Implementations should not be construed as being limited to any aspect, example, or detail provided in this application. Regardless of whether shown and described in combination or separately, the various features (both structural and methodological) are intended to be selectively included or omitted to produce an example with a particular set of features. Having been provided with the description and illustration of the present application, one skilled in the art may envision variations, modifications, and alternate examples falling within the spirit of the broader aspects of the general inventive concept embodied in this application that do not depart from the broader scope.

We claim:

1. A method of improving utilization of a computer-implemented data storage system that includes one or more data storage devices, comprising:
    associating the one or more data storage devices with a data storage system host layer;
    querying the one or more data storage devices for device configuration information;
    determining one or more data storage device management functions that are applicable to the one or more data storage devices;
    determining one or more data storage device management functions that are particular to a given one of the one or more data storage devices;
    assigning data storage device management functions that are particular to the given one of the one or more data storage devices to the given one of the one or more data storage devices; and
    assigning data storage device management functions that are not particular to the given one of the one or more data storage devices to the data storage system host layer.

2. The method of claim 1, wherein the one or more data storage devices include a data storage device selected from the group consisting of: a solid state storage device, a magnetic recording media device, a shingled magnetic recording device, an optical recording devices, and a magnetic tape recording device.

3. The method of claim 1, further comprising utilizing the device configuration information for determining the one or more data storage device management functions that are applicable to each of the one or more data storage devices.

4. The method of claim 3, further comprising passing the device configuration information to a data storage system file system.

5. The method of claim 4, further comprising utilizing the device configuration information for assigning one or more memory allocation functions to the data storage system file system in association with the one or more data storage devices.

6. The method of claim 1, further comprising:
establishing an interface between the data storage system host layer and the one or more data storage devices, and
directing, via the interface, under the command of the data storage system host layer, storage of data to particular storage areas on the one or more data storage devices.

7. The method of claim 6, wherein directing storage of data to particular storage areas of the one or more data storage devices includes:
directing storage of sequential data writes from a first storing application to a first storage area of the one or more data storage devices;
directing storage of sequential data writes from a second storing application to a second storage area of the one of more data storage devices;
wherein the sequential data writes from the first storing application are stored separately from the sequential data writes from the second storing application.

8. The method of claim 7, wherein directing storage of data to particular storage areas on the given one of the one or more data storage devices includes converting one or more file system storage area allocations into one or more actual storage allocations on the given one of the one or more data storage devices.

9. The method of claim 1, further comprising applying by the data storage system host layer one or more data storage policies for managing data storage on each of one or more data storage devices operating in the data storage system.

10. The method of claim 9, wherein applying one or more data storage policies includes applying a policy for causing the one or more data storage devices to erase a data storage area immediately before returning data storage operation to the data storage system host layer when the data storage system host layer deallocates the storage area.

11. The method of claim 9, wherein during storage reallocation of a data storage area on the one or more data storage devices by the data storage system host layer, applying one or more data storage policies includes applying a policy for causing an immediate erase of a previously de-allocated block or zone into which data storage is allocated when the data storage system host layer indicates it is going to allocate the storage area for data storage, but where there are no currently available erase blocks or zones in the storage area.

12. The method of claim 9, wherein applying one or more data storage policies includes applying a policy for causing the one or more data storage devices to erase de-allocated but not erased blocks or zones during an idle period when the one or more data storage devices detect an idle period in which no current data read, write, or erase operation is in progress.

13. A improved data storage system, comprising:
a file system operative to control data storage to one or more data storage devices and manage allocation of storage areas on the one or more data storage devices for storage of data;
a data storage system host layer operative to translate communications between the file system and the one or more data storage devices;
a block allocator interface operative, at the direction of the data storage system host layer, to direct the storage of data to particular storage areas on the one or more data storage devices; and
each of the one or more data storage devices operative to manage storage device functions that are particular to their own device storage configurations.

14. The data storage system of claim 13, wherein the data storage system host layer is further operative to manage one or more storage device functions that are not particular to a given one of the one or more data storage devices, wherein said one or more storage device functions are generally applicable to each of the one or more data storage devices.

15. The data storage system of claim 14, wherein the block allocator interface is further operative to cause the storage of sequential data writes to small multiple storage areas on the one or more data storage devices instead of storage of data to large contiguous regions of the one or more data storage devices.

16. A method of improving utilization of a data storage system, comprising:
associating a first data storage device with a data storage system host layer;
determining one or more data storage device management functions that are particular to the first data storage device;
determining one or more data storage device management functions that are not particular to the first data storage device;
assigning the one or more data storage device management functions that are particular to the first data storage device to the first data storage device;
assigning the one or more data storage device management functions that are not particular to the first data storage device to the data storage system host layer;
establishing an interface between the data storage system host layer and the first data storage device;
applying, via the interface, one or more data storage policies for managing data storage on the first data storage device; and
directing, via the interface, under the command of the data storage system host layer, storage of data to particular storage areas on the first data storage device.

17. The method of claim 16, wherein determining the one or more data storage device management functions that are not particular to the first data storage device includes determining one or more data storage device management functions that are applicable to one or more different data storage devices.

18. The method of claim 17, further comprising assigning the one or more data storage device management functions that are particular to the one or more different data storage devices to the data storage system host layer.

19. The method of claim 18, further comprising assigning the one or more data storage device management functions that are particular to the one or more different data storage devices to the one or more different data storage devices such that data storage device management functions that are particular to a given data storage device are assigned to the given data storage system device and data storage management functions that are not particular to the given data storage device are assigned to the data storage system host layer for application by the data storage system host layer to any data storage system device operating under direction of the data storage system host layer.

* * * * *